(12) United States Patent
Cheng et al.

(10) Patent No.: US 11,195,754 B2
(45) Date of Patent: Dec. 7, 2021

(54) TRANSISTOR WITH REDUCED GATE RESISTANCE AND IMPROVED PROCESS MARGIN OF FORMING SELF-ALIGNED CONTACT

(71) Applicant: International Business Machines Corporation, Armonk, NY (US)

(72) Inventors: Kangguo Cheng, Schenectady, NY (US); Zhenxing Bi, Schenectady, NY (US); Juntao Li, Cohoes, NY (US); Dexin Kong, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 584 days.

(21) Appl. No.: 16/155,498

(22) Filed: Oct. 9, 2018

(65) Prior Publication Data

US 2020/0111706 A1 Apr. 9, 2020

(51) Int. Cl.
*H01L 21/768* (2006.01)

(52) U.S. Cl.
CPC .. *H01L 21/76897* (2013.01); *H01L 21/76829* (2013.01)

(58) Field of Classification Search
CPC ......... H01L 21/76897; H01L 21/76829; H01L 21/823437; H01L 21/823456; H01L 21/823468; H01L 51/0011
See application file for complete search history.

(56) References Cited

U.S. PATENT DOCUMENTS

| | | |
|---|---|---|
| 5,340,758 A | 8/1994 | Wei et al. |
| 5,670,062 A | 9/1997 | Lin et al. |
| 6,218,715 B1 | 4/2001 | Kim et al. |
| 7,563,701 B2 | 7/2009 | Chang et al. |
| 8,735,999 B2 | 5/2014 | Ohguro |
| 9,054,178 B2 | 6/2015 | Bohr et al. |
| 9,293,576 B2 | 3/2016 | Cheng et al. |
| 2002/0022364 A1 | 2/2002 | Hatta et al. |
| 2006/0157709 A1 | 7/2006 | Green |
| 2006/0273391 A1 | 12/2006 | Diaz et al. |
| 2015/0091100 A1* | 4/2015 | Xie ........................ H01L 29/785 257/401 |
| 2020/0058748 A1* | 2/2020 | Bae ................. H01L 21/823468 |

* cited by examiner

*Primary Examiner* — Matthew E. Gordon
(74) *Attorney, Agent, or Firm* — Scully, Scott, Murphy & Presser, P.C.; L. Jeffrey Kelly, Esq.

(57) ABSTRACT

A semiconductor structure is provided that includes a gate conductor structure having a middle portion that has a vertical thickness that is greater than a vertical thickness of each end portion, and a self-aligned dielectric gate cap located on the gate conductor structure and having a middle portion that has a vertical thickness that is less than a vertical thickness of each end portion. The aforementioned gate conductor structure, which is taller in the middle and shorter at the edges, has reduced gate resistance, while the aforementioned self-aligned dielectric gate cap, which is taller at the edges and shorter in the middle, increases process margin for contact formation.

10 Claims, 6 Drawing Sheets

TRANSISTOR WITH REDUCED GATE RESISTANCE AND IMPROVED PROCESS MARGIN OF FORMING SELF-ALIGNED CONTACT

BACKGROUND

The present application relates to a semiconductor structure and a method of forming the same. More particularly, the present application relates to a semiconductor structure including at least one functional gate structure having reduced gate resistance and a self-aligned dielectric cap that is designed to increase process margin for self-aligned contact formation.

Self-aligned contact becomes inevitable for 10 nm node and beyond technologies due to highly scaled gate pitch. Self-aligned contact requires a self-aligned dielectric cap on top of a conductive material of a functional gate structure to electrically isolate the source/drain contact from the conductive material of the functional gate structure.

Due to the finite etch selectively between the self-aligned dielectric cap and an interlayer dielectric (ILD) material that laterally surrounds the functional gate structure, the erosion of the self-aligned dielectric cap corner is inevitable. As a result, the self-aligned dielectric cap has to be thick enough to prevent source/drain contact which can lead to source/drain contact structure to conductive material shorts and dielectric breakdown (i.e., reliability) issues. A thick self-aligned dielectric cap also means deep conductive material recess, which reduces the conductive material volume and thus increases gate resistance.

There is thus a need for providing a semiconductor structure including a functional gate structure having reduced gate resistance and a self-aligned dielectric cap that overcomes the drawbacks mentioned above for prior art self-aligned dielectric caps.

SUMMARY

A semiconductor structure is provided that includes a gate conductor structure having a middle portion that has a vertical thickness that is greater than a vertical thickness of each end portion, and a self-aligned dielectric cap located on the gate conductor structure and having a middle portion that has a vertical thickness that is less than a vertical thickness of each end portion. The aforementioned gate conductor structure, which is taller in the middle and shorter at the edges, has reduced gate resistance, while the aforementioned self-aligned dielectric cap, which is taller at the edges and shorter in the middle, increases process margin for contact formation.

In one aspect of the present application, a semiconductor structure is provided. In one embodiment, the semiconductor structure includes a functional gate structure located on a surface of a semiconductor material substrate. The functional gate structure includes a gate conductor structure having a middle portion that has a vertical thickness that is greater than a vertical thickness of each end portion. A self-aligned dielectric cap is located on the gate conductor structure. The self-aligned dielectric cap has a middle portion that has a vertical thickness that is less than a vertical thickness of each end portion. A contact structure contacts at least one source/drain region of the functional gate structure.

In another aspect of the present application, a method of forming a semiconductor structure is provided. In one embodiment, the method includes forming a functional gate structure on a surface of a semiconductor material substrate, wherein a dielectric spacer is located on a sidewall of the functional gate structure and a first interlayer dielectric (ILD) material laterally surrounds the dielectric spacer. The dielectric spacer is then recessed, and thereafter a gate conductor material of the functional gate structure is etched to provide a gate conductor structure having a middle portion that has a vertical thickness that is greater than a vertical thickness of each end portion. A self-aligned dielectric cap is formed on the gate conductor structure. The self-aligned dielectric cap has a middle portion that has a vertical thickness that is less than a vertical thickness of each end portion. A second interlayer dielectric (ILD) material is formed over the first ILD material and the self-aligned dielectric cap. A contact opening is then formed into the first and second ILD materials that physically exposes one of the source/drain regions of the functional gate structure and, thereafter a contact structure is formed into the contact opening and contacting the physically exposed source/drain region.

DETAILED DESCRIPTION

Figure 1:
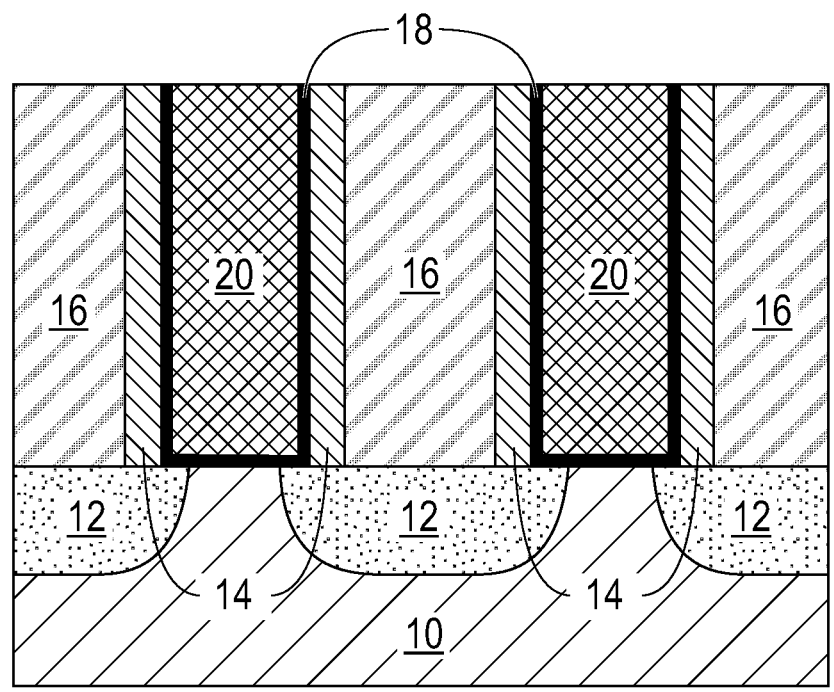
FIG. 1 is a cross sectional view of an exemplary semiconductor structure of the present application and during an early stage of stage of fabrication, the structure including a functional gate structure located on a surface of a semiconductor material substrate, wherein a dielectric spacer is located on a sidewall of the functional gate structure and a first interlayer dielectric (ILD) material laterally surrounds the dielectric spacer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure of the present application and during an early stage of stage of fabrication. The exemplary structure of FIG. 1 includes a functional gate structure (18, 20) located on a surface of a semiconductor material substrate 10, wherein a dielectric spacer 14 is located on a sidewall of the functional gate structure (18, 20) and a first interlayer dielectric (ILD) material 16 laterally surrounds the dielectric spacer 14. As is shown, the exemplary structure of FIG. 1 includes source/drain regions 12 located in the semiconductor material substrate 10.

Although the drawings of the present application illustrate two functional gate structures (18, 20) located on semiconductor material substrate 10, the present application contemplates embodiments in which only a single functional gate structure or more than two functional gate structures are formed. By "functional gate structure" it is meant an active gate structure used to control output current (i.e., flow of carriers in the channel) of a semiconducting device through electrical or magnetic fields. Each functional gate structure includes a gate dielectric material layer 18 and a gate conductor material 20.

In one embodiment of the present application, the exemplary semiconductor structure of FIG. 1 can be formed utilizing a gate first process. In a gate first process, the functional gate structure (18, 20) is first formed on a surface of semiconductor material substrate 10. After forming the functional gate structure (18, 20), the dielectric spacer 14 is formed on the sidewalls of the gate structure. The source/drain regions 12 are formed into the semiconductor material substrate 10 and at the footprint of each functional gate structure (18, 20). Next, the first ILD material 16 is formed. In such an embodiment, the gate dielectric material layer 18 is located only beneath a bottommost surface of the gate conductor material 20.

In another embodiment of the present application, the exemplary semiconductor structure of FIG. 1 can be formed utilizing a gate last process. In a gate last process, at least one sacrificial gate structure (not shown) is first formed on a surface of semiconductor material substrate 10. After forming the sacrificial gate structure, the dielectric spacers 14 are formed. Next, source/drain regions 12 are formed into the semiconductor material substrate 10 and at the footprint of each sacrificial gate structure. Next, the first ILD material 16 is formed. After forming the first ILD material 16, each sacrificial gate structure is removed and replaced with a functional gate structure (18, 20). In such an embodiment as shown in FIG. 1, the gate last process provides a structure in which the gate dielectric material layer 18 is present along the sidewalls of each gate conductor material 20 and beneath a bottommost surface of the gate conductor material 20. In such an embodiment, the gate dielectric material layer 18 may be referred to as a U-shaped gate dielectric material layer.

The semiconductor material substrate 10 of the present application is composed of one or more semiconductor materials having semiconducting properties. Examples of semiconductor materials that may be used as the semiconductor material substrate 10 include, but are not limited to, silicon (Si), a silicon germanium (SiGe) alloy, a silicon germanium carbide (SiGeC) alloy, germanium (Ge), a III/V compound semiconductor, or a II/VI compound semiconductor.

In one embodiment, the semiconductor material substrate 10 may be a bulk semiconductor substrate. The term "bulk semiconductor substrate" denotes a substrate that is composed entirely of one or more semiconductor materials, as defined above. In such an embodiment, the functional gate structure (18, 20) is located only upon a topmost surface of the semiconductor material substrate 10.

In another embodiment, the semiconductor material substrate 10 may be a topmost semiconductor material layer of a semiconductor-on-insulator (SOI) substrate. The SOI substrate further include an insulator layer that contacts a bottommost surface of the topmost semiconductor material layer, and a handle substrate that contacts a bottommost surface of the insulator layer; in other terms an SOI substrate includes an insulator layer sandwiched between a topmost surface material layer and a handle substrate. In such an embodiment, the functional gate structure (18, 20) is located only upon a topmost surface of the semiconductor material substrate 10.

In a further embodiment of the present application, the semiconductor material substrate 10 may be a semiconductor material fin. The term "semiconductor material fin" refers to a structure composed of a semiconductor material, as defined above, that includes a pair of vertical sidewalls that are parallel to each other. A surface is "vertical" if there exists a vertical plane from which the surface does not deviate by more than three times the root mean square roughness of the surface. In one embodiment, the semiconductor material fin has a height from 20 nm to 200 nm, a width from 5 nm to 30 nm, and a length from 20 nm to 200 nm. Other heights and/or widths and/or lengths that are lesser than, or greater than, the ranges mentioned herein can also be used in the present application. In such an embodiment, a single semiconductor material fin or a plurality of semiconductor material fins may be employed. The semiconductor material fin(s) can be formed by patterning an upper portion of a bulk semiconductor substrate, as defined above, or by patterning of a topmost semiconductor layer of a SOI substrate, as defined above. Patterning may be performed by lithography and etching, a sidewall image transfer (SIT) process or by direct self-assembly (DSA) process in which a copolymer that is capable of direct self-assembly is used.

In a yet further embodiment of the present application, the semiconductor material substrate 10 may be a semiconductor nanowire. The term "semiconductor nanowire" refers to a structure composed of a semiconductor material, as defined above, that has a diameter on the order of a few nanometers or less. A single semiconductor nanowire or a plurality of semiconductor nanowires may be employed. When a plurality of nanowires is employed, the nanowires may be in a vertical stacked configuration or they may be located laterally adjacent to each other. The semiconductor nanowire(s) can be formed utilizing techniques well known to those skilled in the art. The semiconductor material substrate 10 can also be a semiconductor nanosheet. A semiconductor nanosheet is a sheet of a semiconductor material. The nanosheets may be formed utilizing techniques well known to those skilled in the art.

The source/drain regions 12 are composed of a semiconductor material, as defined above, and a p-type dopant or an n-type dopant. Typically, but not necessarily always, the source/drain regions 12 are composed of a same semiconductor material as the semiconductor material substrate 10. In embodiments in which the source/drain regions 12 are composed of a different semiconductor material than the semiconductor material substrate 10, a strain may be applied to a channel region of the functional gate structure (18, 20). As is known to those skilled in the art, the channel region is a portion of the semiconductor material substrate 10 that is located beneath the functional gate structure (18, 20) and between a source region that is located on one side of the functional gate structure, and a drain region that is located on the other side of the functional gate structure. The source region and the drain region are referred to herein as source/drain regions 12. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain regions may have a dopant concentration of from $4 \times 10^{20}$ atoms/cm$^3$ to $3 \times 10^{21}$ atoms/cm$^3$.

In some embodiments, the source/drain regions 12 can be formed by introducing a p-type dopant or an n-type dopant, as defined above, into portions of the semiconductor material substrate 10. The dopants may be introduced into portions of the semiconductor material substrate 10 by ion implantation, gas phase doping, or by using a sacrificial material that contains one of the dopants mentioned above.

In another embodiment, the source/drain regions 12 can be formed by forming source/drain trenches into the semiconductor material substrate 10 and thereafter filling of each trench with an n-type or p-type doped semiconductor material. The filling of the source/drain trenches may include an epitaxial growth process. The term "epitaxial growth" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the of the source/drain regions 12 can be performed utilizing any well known precursor gas or gas mixture. Carrier gases like hydrogen, nitrogen, helium and argon can be used. In some embodiments, the n-type dopant of p-type dopant is introduced into the precursor gas or gas mixture. In other embodiments, the n-type dopant of p-type dopant is introduced into an intrinsic semiconductor material that is epitaxially grown into each source/drain trench.

As mentioned above, the functional gate structure (18, 20) may include a gate dielectric material layer 18 and a gate conductor material 20. The gate dielectric material layer 18 includes any gate dielectric material. The gate dielectric material that provides the gate dielectric material layer 18 can be an oxide, nitride, and/or oxynitride. In one example, the gate dielectric material that provides the gate dielectric material layer 18 can be a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_X$, a silicate thereof, and an alloy thereof. Each value of x is independently from 0.5 to 3 and each value of y is independently from 0 to 2. In some embodiments, a multi-layered gate dielectric structure composed of different gate dielectric materials, e.g., silicon dioxide, and a high-k gate dielectric, can be formed and used as the gate dielectric material layer 18.

The gate dielectric material used in providing gate dielectric material layer 18 can be formed by any deposition process including, for example, atomic layer deposition (ALD), chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric material layer 18 can have a thickness in a range from 1 nm to 10 nm. Other thicknesses that are lesser than, or greater than, the aforementioned thickness range can also be employed for the gate dielectric material that may provide the gate dielectric material layer 18.

The gate conductor material 20 of the functional gate structure includes any conductive material including, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, a workfunction setting layer (not shown) may be located between the gate dielectric material layer 18 and the gate conductor material 20. The workfunction setting layer can be a workfunction metal (WFM). The WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both the gate conductor material 20 and the WFM.

The gate conductor material 20 and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. When a metal silicide is formed, a conventional silicidation process is employed. In one embodiment, the gate conductor material used in providing the gate conductor material 20 can have a thickness from 50 nm to 200 nm. Other thicknesses that are lesser than, or greater than, the aforementioned thickness range can also be employed for the gate conductor material used in providing the gate conductor material 20.

The functional gate structure (18, 20) can be formed by providing a functional gate material stack of the gate dielectric material, and the gate conductor material. A planarization process may follow the formation of the functional gate material stack. In one embodiment, and when multiple functional gate structures are formed, each functional gate structure may be composed of the same gate dielectric material and/or gate conductor material. In another embodiment, and when multiple functional gate structures are formed, a first set of functional gate structures may be composed of a first gate dielectric material and a first gate conductor material, while a second set of functional gate structures may be composed of a second gate dielectric material and a second gate conductor material. In such an embodiment, the second gate conductor material is typically different from the first gate conductor material; the first and second gate dielectric materials may be the same or different. In such an embodiment, block mask technology may be used to provide functional gate structures that have at least different gate conductor materials.

The dielectric spacer 14 is composed of a dielectric spacer material. The dielectric spacer material is typically different from the gate dielectric material that provides the gate dielectric material layer 18. One example of a dielectric spacer material that may be employed in the present application is silicon nitride. The dielectric spacer 14 may be formed by deposition of a dielectric spacer material, followed by a spacer etch. The deposition of the dielectric spacer material includes, for example, atomic layer deposition (ALD), chemical vapor deposition (CVD), plasma enhanced chemical vapor deposition (PECVD), or physical vapor deposition (PVD). The spacer etch may include a reactive ion etch. In some embodiments (not shown), the dielectric spacer 14 contacts an entirety of a sidewall of the gate conductor material 20. In other embodiments (as illustrated in FIG. 1), the dielectric spacer 14 contacts a sidewall of the gate dielectric material layer 14.

The first ILD material 16, which is laterally adjacent to the dielectric spacer and laterally surrounds the functional gate structure (18, 20), is composed of a dielectric material that is compositionally different from the dielectric material of the dielectric spacer 14. Examples of dielectric materials that can be used as the first ILD material 16 in the present application include silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In some embodiments, a dielectric liner (e.g., silicon nitride, not shown) is formed prior to the first ILD material 16 and is located on the sidewalls of the dielectric spacer 14 and on top of the source/drain regions 12.

In one embodiment, the first ILD material 16 can be formed by a deposition process such as, for example, chemical vapor deposition (CVD), plasma enhanced chemical vapor deposition (PECVD), evaporation or spin-on coating. Following the deposition of the ILD material 16, a planarization process such as, for example, chemical mechanical polishing (CMP) and/or grinding, may or may not be employed. The first ILD material 16 typically has a topmost surface that is coplanar with a topmost surface of the dielectric spacer 14, and a topmost surface of each functional gate structure (18, 20).

Figure 2:
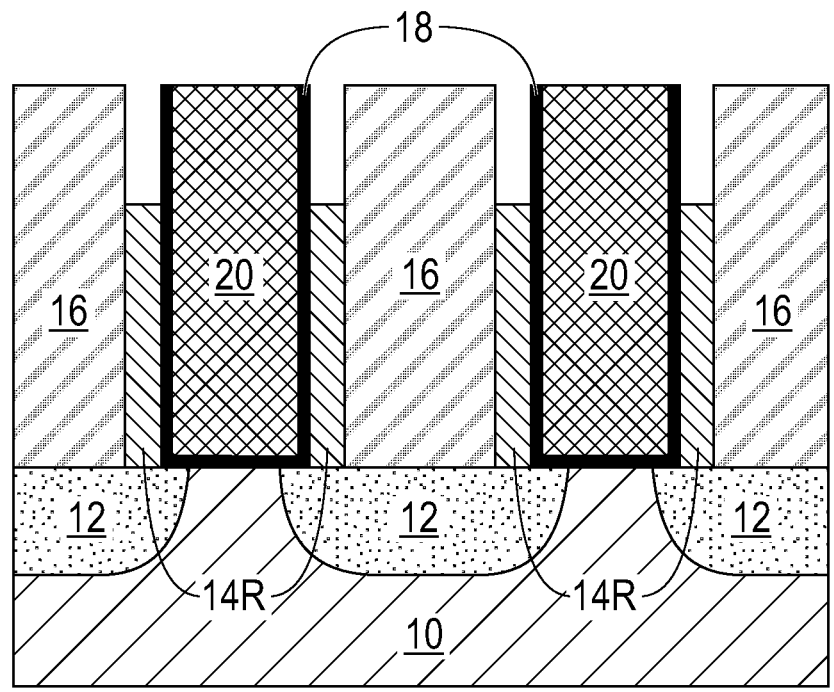
FIG. 2 is a cross sectional view of the exemplary semiconductor structure of FIG. 1 after recessing the dielectric spacer.

Referring now to FIG. 2, there is illustrated the exemplary semiconductor structure of FIG. 1 after recessing the dielectric spacer 14. The remaining portion of the dielectric spacer 14 after recessing may be referred to a first recessed dielectric spacer 14R. The recessing of the dielectric spacer 14 may be performed utilizing an isotropic etching process such as, for example, reactive ion etching, chemical dry etching, or chemical wet etching. The first recessed dielectric spacer 14R has a height, i.e., vertical thickness, which is less than the original height, i.e., vertical thickness, of the dielectric spacer 14. The first recessed dielectric spacer 14R has a topmost surface that is located beneath the topmost surface of the first ILD material 16 and a topmost surface of the functional gate structure (18, 20). In embodiments in which the gate dielectric material layer 18 is U-shaped, an upper portion of a sidewall of the dielectric spacer material layer 18 is physically exposed. In embodiments in which the gate dielectric material layer 18 is non-U-shaped, an upper portion of a sidewall of the gate conductor material 20 is physically exposed.

Figure 3:
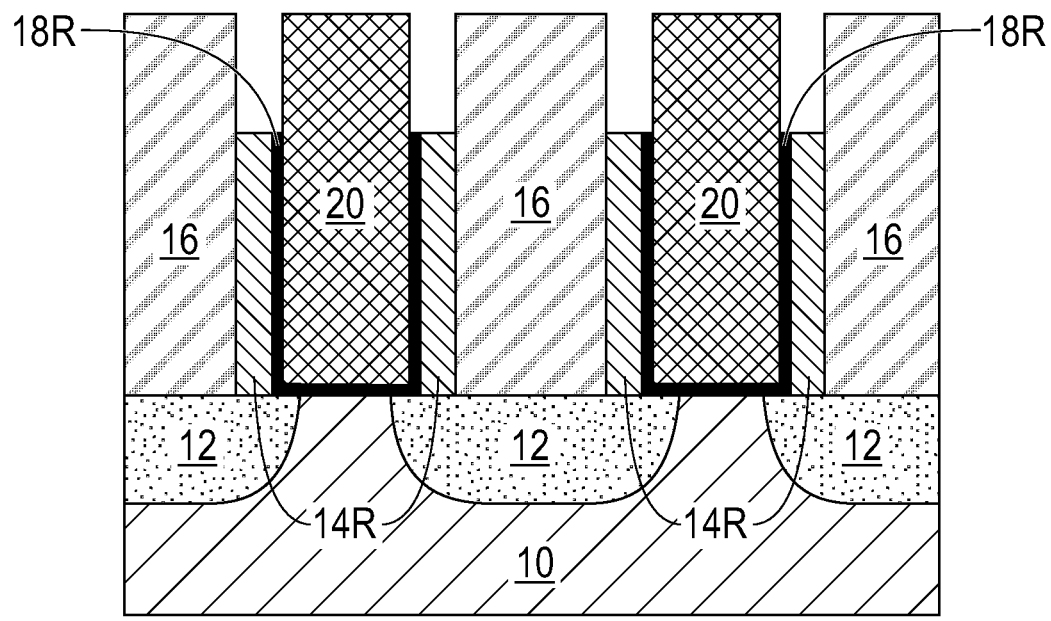
FIG. 3 is a cross sectional view of the exemplary semiconductor structure of FIG. 2 after recessing the gate dielectric material layer of the functional gate structure.

Referring now to FIG. 3, there is illustrated the exemplary semiconductor structure of FIG. 2 after recessing the gate dielectric material layer 18 of the functional gate structure (18, 20). In some embodiments and when the gate dielectric material layer 18 is other than U-shaped, this step of the present application may be omitted. The remaining portion of the gate dielectric material layer 18 after recessing may be referred to a first recessed gate dielectric material layer 18R. The recessing of the gate dielectric material layer 18 may be performed utilizing an isotropic etching process such as, for example, plasma etching, or chemical wet etching.

The first recessed gate dielectric material layer 18R has a height, i.e., vertical thickness, that is less than the original height, i.e., vertical thickness, of the gate dielectric material layer 18. The first recessed gate dielectric material layer 18R has a topmost surface that is located beneath the topmost surface of the first ILD material 16 and a topmost surface of the gate conductor material 20. In the illustrated embodiment, the recessing of the gate dielectric material layer 18, physically exposes an upper portion of a sidewall of the gate conductor material 20.

The height, i.e., vertical thickness, of the first recessed gate dielectric material layer 18R may be the same as, or different from, the height, i.e., vertical thickness, of the first recessed spacer 14R. FIG. 3 illustrates an embodiment in which the first recessed gate dielectric material layer 18R and the first recessed dielectric spacer 14R have a same height, i.e., vertical thickness, thus the topmost surfaces of the first recessed gate dielectric material layer 18R and the first recessed dielectric spacer 14R are coplanar with each other.

Figure 4:
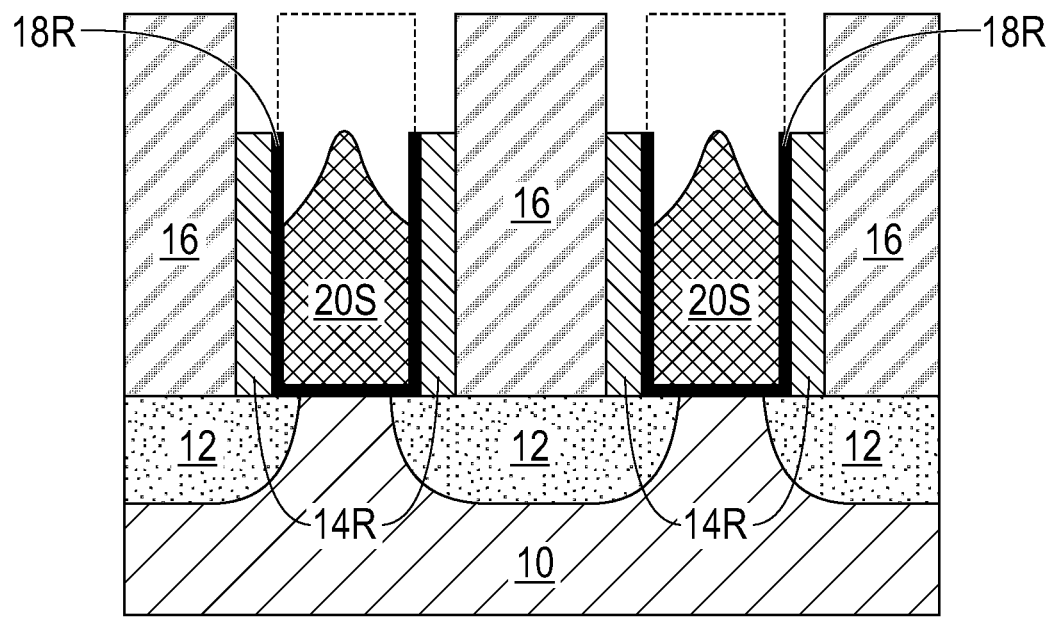
FIG. 4 is a cross sectional view of the exemplary semiconductor structure of FIG. 3 after etching the gate conductor material to provide a gate conductor structure having a middle portion that has a vertical thickness that is greater than a vertical thickness of each end portion.

Referring now to FIG. 4, there is illustrated the exemplary semiconductor structure of FIG. 3 after etching the gate conductor material 20 to provide a gate conductor structure 20S having a middle portion that has a vertical thickness (i.e., height) that is greater than a vertical thickness (i.e., height) of each end portion; the end portions are located laterally adjacent each first recessed dielectric spacer 14R. That is, the gate conductor structure 20S that is provided by this etch is taller in the middle of the gate conductor structure 20S and shorter at the end portions of the gate conductor structure 20S. In FIG. 4, the dotted line represents the original height of the gate conductor material 20 prior to performing this etch. A functional gate structure including gate conductor structure 20S has reduced gate resistance. The etch used in providing the gate conductor structure 20S is an isotropic etch that is selective in removing a gate conductive material. The middle portion of the gate conductor structure 20S may have a topmost surface that is coplanar with, above, or below, the topmost surface of first recessed gate dielectric material layer 18R and the first recessed dielectric spacer 14R. The end portions of the gate conductor structure 20S have topmost surfaces that are below the topmost surface of the first recessed gate dielectric material layer 18R and the first recessed dielectric spacer 14R.

Figure 5:
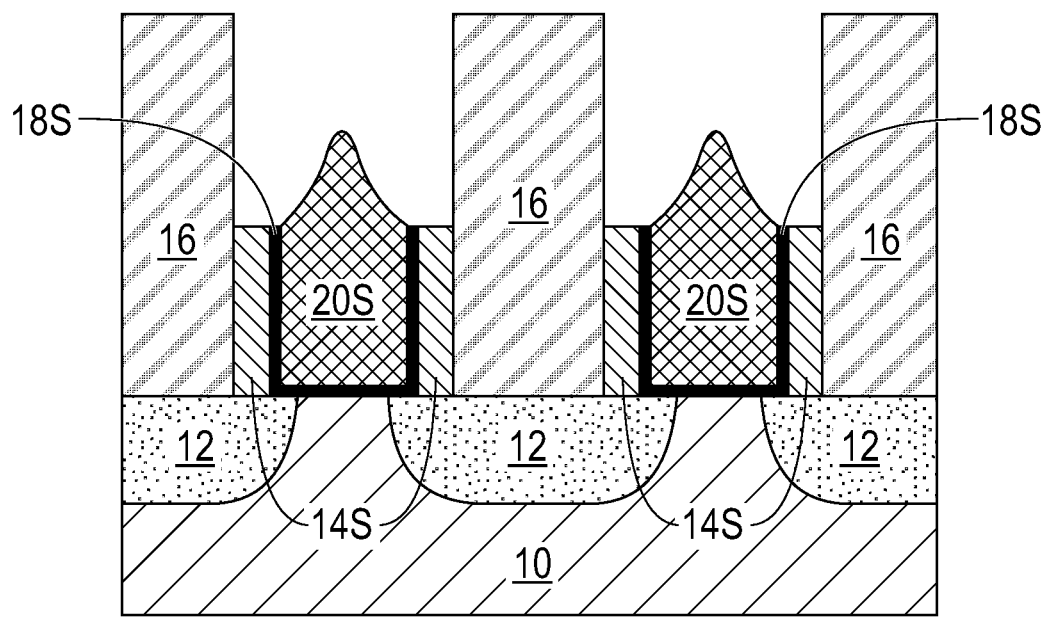
FIG. 5 is a cross sectional view of the exemplary semiconductor structure of FIG. 4 after second recessing of the dielectric spacer and the gate dielectric material layer.

Referring now to FIG. 5, there is illustrated the exemplary semiconductor structure of FIG. 4 after second recessing of the dielectric spacer (i.e., the first recessed dielectric spacer 14R) and the gate dielectric material layer (i.e., the first recessed gate dielectric material layer 18R). In some embodiments, the second recessing of the dielectric spacer and/or the gate dielectric material layer may be omitted.

The remaining portion of the first recessed dielectric spacer 14R may be referred to herein as a second recessed dielectric spacer 14S, while the remaining portion of the first recessed gate dielectric material layer 18R may be referred to a second recessed gate dielectric material layer 18S. The second recessing of the first recessed dielectric spacer 14R typically occurs prior to the second recessing of the first recessed gate dielectric material layer 18R.

The second recessing of the first recessed dielectric spacer 14R may be performed utilizing one the anisotropic etching processes mentioned above for recessing the dielectric spacer 14. The second recessed dielectric spacer 14S has a height, i.e., vertical thickness, that is less than the height, i.e., vertical thickness, of the recessed dielectric spacer 14R. The second recessed dielectric spacer 14S has a topmost surface that is located beneath the topmost surface of the first ILD material 16 and a topmost surface of the gate material structure 20S. In embodiments in which a U-shaped gate dielectric material layer is used, an upper portion of a sidewall of the first recessed dielectric spacer material layer 18R is physically exposed. In embodiments in which the gate dielectric material layer 18 is non-U-shaped, an upper portion of a sidewall of the gate conductor structure 20S is physically exposed.

The second recessing of the first recessed gate dielectric material layer 18R may be performed utilizing one the etching processes mentioned above for recessing the gate dielectric material layer 18. The second recessed gate dielectric material layer 18S has a height, i.e., vertical thickness, that is less than the height, i.e., vertical thickness, of the first recessed gate dielectric material layer 18R. The second recessed gate dielectric material layer 18S has a topmost surface that is located beneath the topmost surface of the first ILD material 16 and a topmost surface of the gate material structure 20S. In embodiments in which the gate dielectric material layer 18 is non-U-shaped, an upper portion of a sidewall of the gate conductor structure 20S is physically exposed.

In some embodiments, the second recessed gate dielectric material layer 18S may have a vertical thickness that is the same as the vertical thickness of second recessed dielectric spacer 14S. In such an embodiment, the second recessed gate dielectric material layer 18S has a topmost surface that is coplanar with a topmost surface of the second recessed dielectric spacer 14S. In some embodiments, the vertical thickness of the second recessed gate dielectric material layer 18S and the vertical thickness of the second recessed dielectric spacer 14S are the same as the vertical thickness of outermost edge of the end portion of the gate conductor structure 20S.

Figure 6:
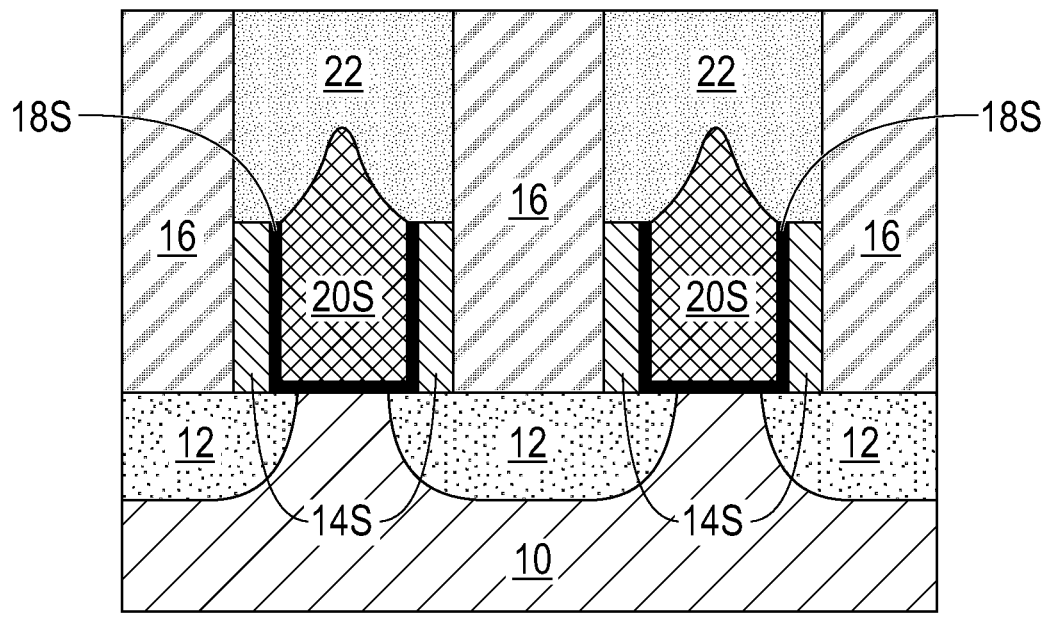
FIG. 6 is a cross sectional view of the exemplary semiconductor structure of FIG. 5 after forming a self-aligned dielectric cap on the gate conductor structure, wherein the self-aligned dielectric cap has a middle portion that has a vertical thickness that is less than a vertical thickness of each end portion.

Referring now to FIG. 6, there is illustrated the exemplary semiconductor structure of FIG. 5 after forming a self-aligned dielectric cap 22 on gate conductor structure 20S, wherein the self-aligned dielectric cap 22 has a middle portion that has a vertical thickness that is less than a vertical thickness of each end portion. The self-aligned dielectric cap 22 of the present application improves the process margin for forming a self-aligned source/drain contact structure (see, element 34 in FIG. 9 of the present application).

As is shown, the middle portion of the self-aligned dielectric cap 22 coincides over the middle portion of the gate conductor structure 20S. In some embodiments, and as is shown in FIG. 6, each end portion of the self-aligned dielectric cap 22 extends onto a topmost surface of a remaining portion of the gate dielectric material layer (i.e., either the first or second recessed gate dielectric material layer (18R, 18S)) and a topmost surface of a remaining portion of the dielectric spacer (i.e., the first or second recessed dielectric spacer (14R, 14S)). In some embodiments, and when the gate dielectric material layer 18 is located entirely beneath the gate conductor material 20, each end portion of the self-aligned dielectric cap 22 extends onto a topmost surface of a remaining portion of a topmost surface of a remaining portion of the dielectric spacer (i.e., the first or second recessed dielectric spacer (14R, 14S)).

The self-aligned dielectric cap 22 has outermost sidewalls that are vertically aligned to the outermost sidewalls of the remaining portion of the dielectric spacer (i.e., the first or second recessed dielectric spacer (14R, 14S)). The self-aligned dielectric cap 22 has a topmost surface that is coplanar with a topmost surface of the first ILD material 16. The self-aligned dielectric cap 22 has a sidewall that directly contacts an upper sidewall of the first ILD material 16.

The self-aligned dielectric cap 22 is composed of a dielectric material that is compositionally different from the first ILD material 16. In one example, the self-aligned dielectric cap 22 is composed of silicon nitride. Other dielectric materials that may be used in providing the self-aligned dielectric cap 22 include, but are not limited to, silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof.

The self-aligned dielectric cap 22 can be formed utilizing a deposition process such as, for example, CVD, PECVD, ALD, high density plasma CVD (HDP CVD) deposition, sputtering, or any suitable combination of those deposition techniques. A planarization may follow the deposition of the dielectric material that provides the self-aligned dielectric cap 22. Another advantage of the present application is that, the taller gate conductor structure 20S in the middle portion makes the opening above the gate conductor structure 20S easier to fill without void, resulting in a void-free self-aligned dielectric cap 22.

Figure 7:
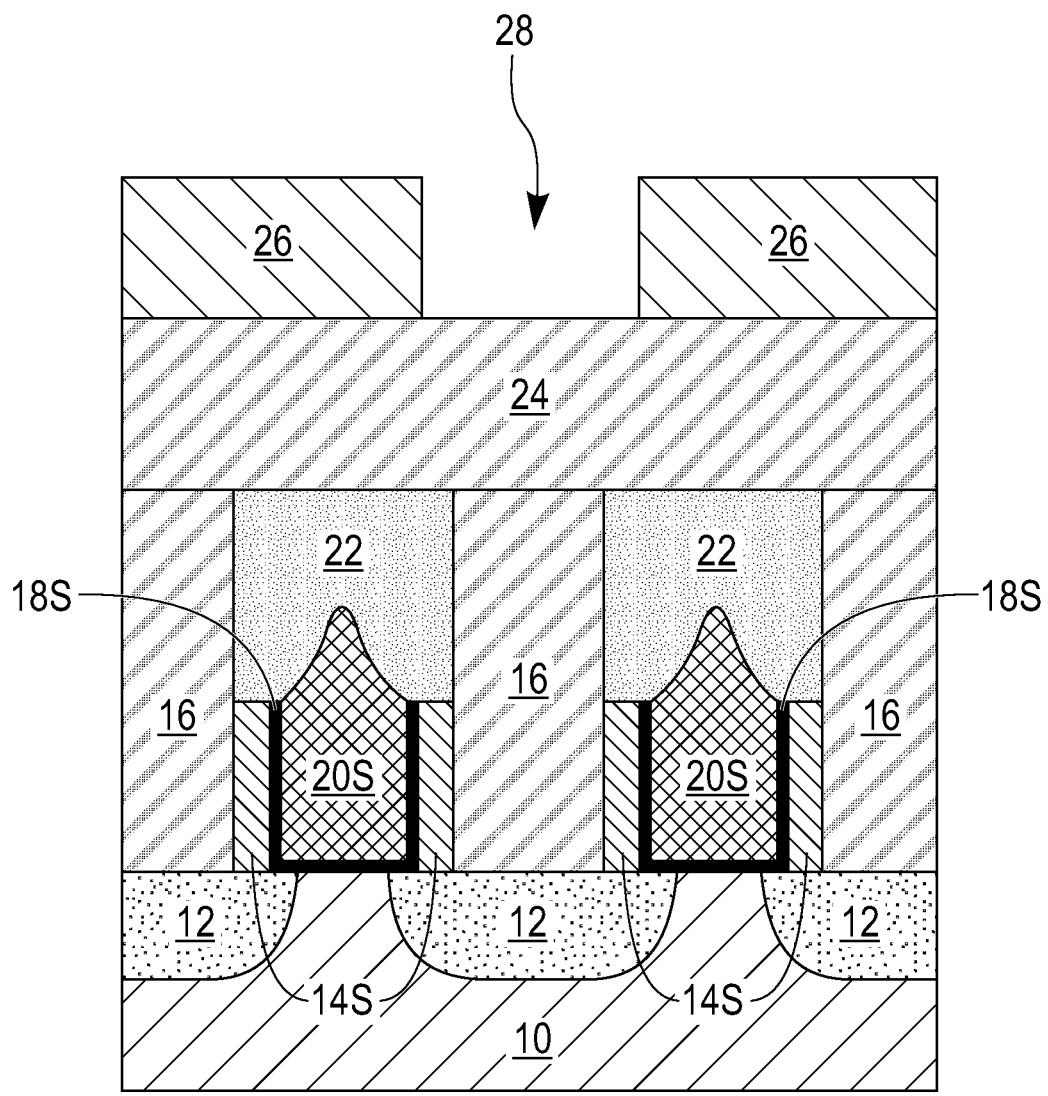
FIG. 7 is a cross sectional view of the exemplary semiconductor structure of FIG. 6 after forming a second ILD material over the first ILD material and the self-aligned dielectric cap, and forming a patterned mask on the second ILD material, wherein the patterned mask has an opening that is located above a source/drain region of the functional gate structure.

Referring now to FIG. 7, there is illustrated the exemplary semiconductor structure of FIG. 6 after forming a second ILD material 24 over the first ILD material 16 and the self-aligned dielectric cap 22, and forming a patterned mask 26 on the second ILD material 24, wherein the patterned mask 26 has an opening 28 that is located above a source/drain region 12 of the functional gate structure (18/20).

The second ILD material 24 is composed of one of the dielectric materials mentioned above for the first ILD material 16 with the proviso that dielectric material that provides the second ILD material 24 is compositionally different from the self-aligned dielectric cap 22. In one embodiment, the second ILD material 24 is composed of a same dielectric material as the first ILD material 16. In another embodiment, the second ILD material 24 is composed of a dielectric material that is compositionally different from the first ILD material 16. The second ILD material 24 may be formed utilizing one of the deposition processes mentioned above for forming the first dielectric material 16. A planarization process may or may not follow the deposition of the dielectric material that provides the second ILD material 24. The second ILD material 24 may have a thickness within the thickness range mentioned above for the first ILD material 16.

The patterned mask 26 is composed of any photoresist material. The patterned mask 26 may be formed by first depositing a photoresist material on the second ILD material 24, and thereafter the deposited photoresist material is patterned by lithography. Lithography includes exposing the photoresist material to a pattern of irradiation and developing the exposed photoresist material utilizing a conventional resist developer. Alternatively, the patterned mask 26 may be formed by a hardmask layer (e.g., titanium nitride). Lithography is then used to pattern the hardmask layer. The hardmask layer is than used to pattern the underneath ILD material to form contact opening.

Figure 8:
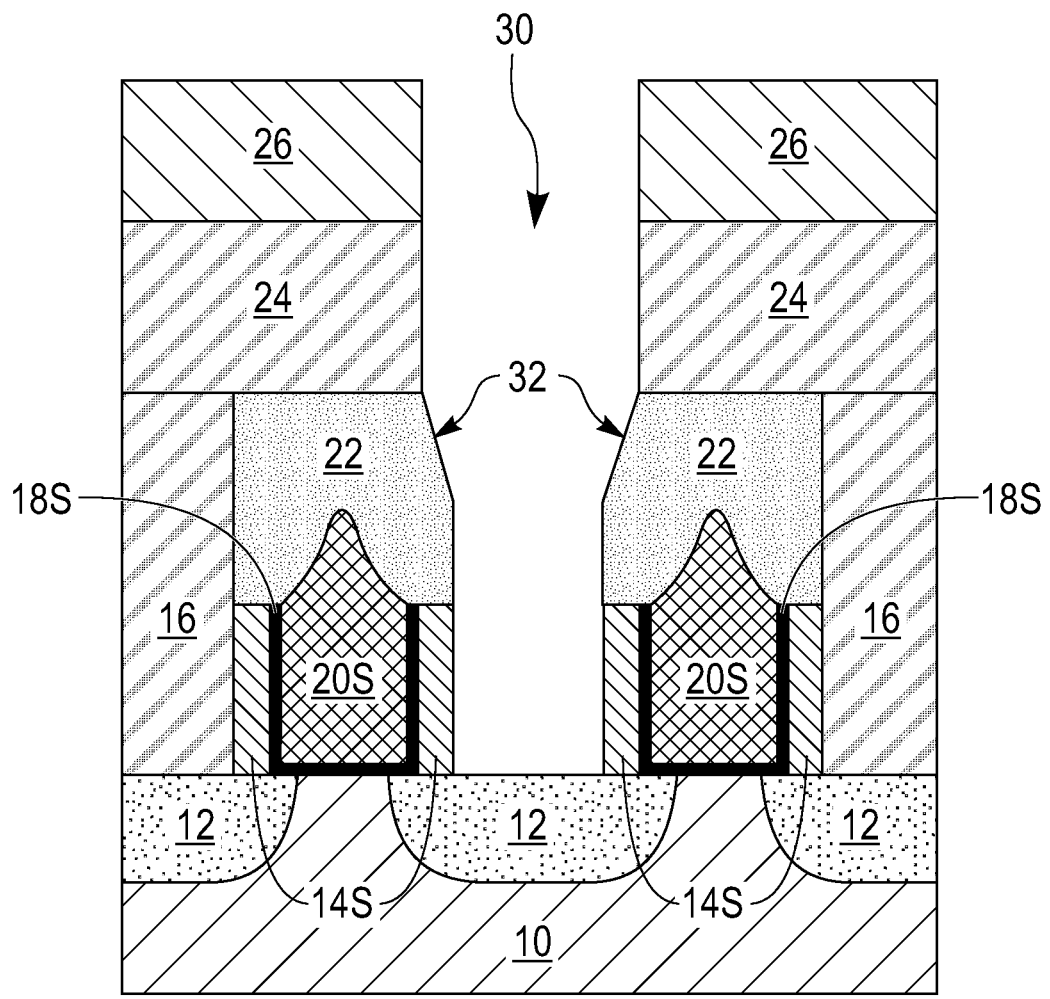
FIG. 8 is a cross sectional view of the exemplary semiconductor structure of FIG. 7 after transferring the opening into the first and second ILD materials to provide a contact opening that physically exposes one of the source/drain regions of the functional gate structure.

Referring now to FIG. 8, there is illustrated the exemplary semiconductor structure of FIG. 7 after transferring the opening 28 into the first and second ILD materials (16, 24) to provide a contact opening 30 that physically exposes one of the source/drain regions 12. During this transferring step, a corner of one of the end portions of the self-aligned dielectric cap 22 is eroded, as is shown in FIG. 8. The transferring of the opening 28 includes one or more anisotropic etching processes such as, for example, a directional reactive ion etch. This step provides a self-aligned dielectric cap 22 in which an upper portion of one of the end portions of the self-aligned dielectric cap 22 has a chamfered (or beveled) surface 32. The chamber surface 32 connects the topmost surface of the self-aligned dielectric cap 22 to a remaining portion of the vertical sidewall of the self-aligned dielectric cap 22.

Figure 9:
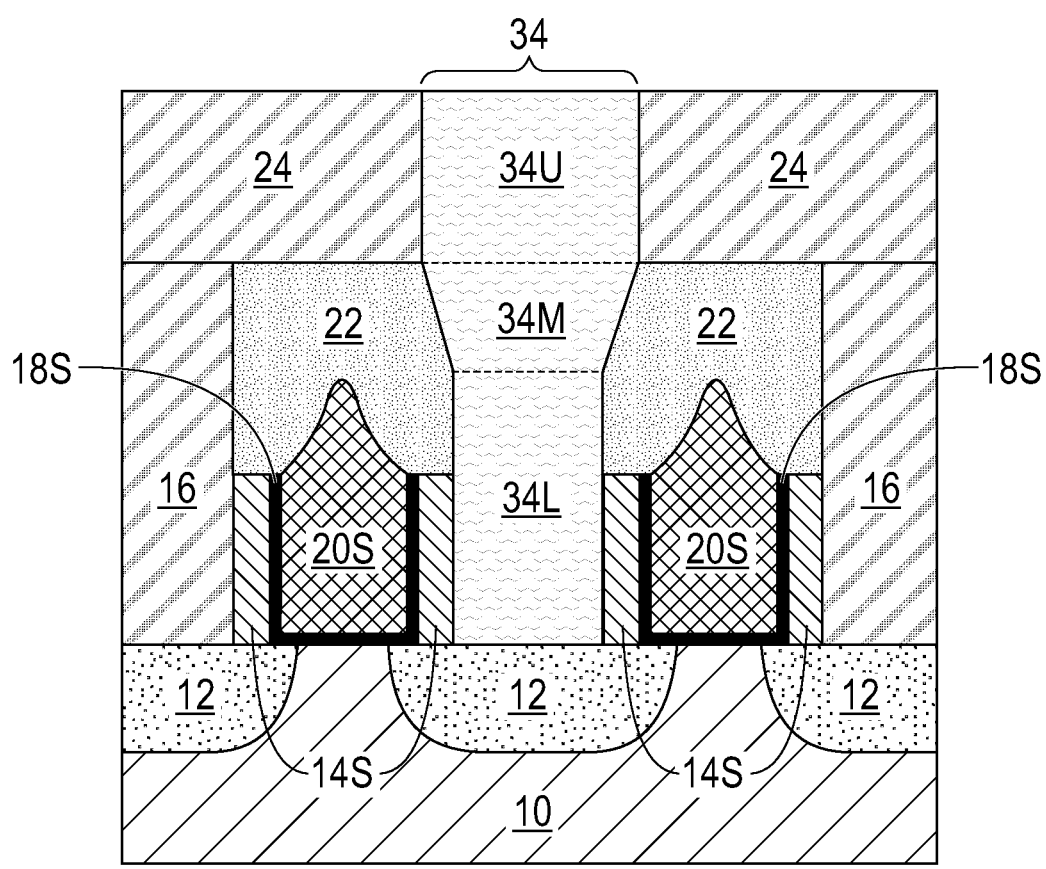
FIG. 9 is a cross sectional view of the exemplary semiconductor structure of FIG. 8 after forming a contact structure into the contact opening and contacting the physically exposed source/drain region.

Referring now to FIG. 9, there is illustrated the exemplary semiconductor structure of FIG. 8 after forming a contact structure 34 into the contact opening 30 and contacting the physically exposed source/drain region 12. The patterned mask 26 may be removed prior to forming the contact structure 34 into each contact opening 30. The patterned mask 26 may be removed utilizing a conventional resist stripping process such as, for example, stripping and/or ashing.

The contact structure 34 is formed by filling the contact opening 30 with a conductive metal-containing fill material; the filling may include any suitable deposition process such as, for example, chemical vapor deposition (CVD), plasma enhanced chemical vapor deposition (PECVD) or atomic layer deposition (ALD). The conductive metal-containing fill material can be composed of tungsten (W), aluminum (Al), copper (Cu), cobalt (Co), nickel (Ni), titanium (Ti), ruthenium (Ru), or any other suitable conductive metal or alloy thereof. A barrier layer that is composed of a barrier material that can prevent diffusion and/or alloying of the conductive metal-containing fill material with the top of the source/drain regions may be formed into the contact opening 30 prior to contact fill. Examples of barrier materials that may be employed in the present application include titanium nitride (TiN), tantalum nitride (TaN), hafnium nitride (HfN), niobium nitride (NbN), tungsten nitride (WN), tungsten carbon nitride (WCN), or any combination thereof. The barrier layer can be formed in the contact openings by a deposition process such as, for example, chemical vapor deposition (CVD), plasma enhanced chemical vapor deposition (PECVD), atomic layer deposition (ALD), or metalorganic chemical vapor deposition (MOCVD). A planarization process may follow the filling of each contact opening with the conductive metal-containing fill material. The contact structure 34 is embedded in the first and second ILD material layers 16 and 24 and has a topmost surface that is coplanar with the second ILD material 24.

The contact structure 34 has an upper portion 34U of a first width and a lower portion 34L of a second width that is less than the first width, wherein the upper and lower portions (24U and 34L, respectively) of the contact structure 34 are separated by a middle portion 34M having tapered sidewalls. In some embodiments, the tapered sidewalls of the middle portion 34M of the contact structure 34 are in direct contact with the chamfered surface 32 of the self-aligned dielectric cap 22. In other embodiments, a portion of the barrier layer (not shown) is in direct contact with the chamfered surface 32 of the self-aligned dielectric cap 22. In some embodiments, the upper portion 34U may be also tapered.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a functional gate structure located on a surface of a semiconductor material substrate, wherein the functional gate structure comprises a gate conductor structure and a gate dielectric material layer, the gate conductor structure comprising a middle portion having a vertical thickness that is greater than a vertical thickness of first and second end portions of the gate conductor structure, the first and second end portions of the gate conductor structure are located on laterally opposite sides of the middle portion of the gate conductor structure;
a dielectric spacer located on a sidewall of the gate dielectric material layer;
a self-aligned dielectric cap located on the gate conductor structure, wherein the self-aligned dielectric cap has a middle portion that has a vertical thickness that is less than a vertical thickness of first and second end portions of the self-aligned dielectric cap, the first and second end portions of the self-aligned dielectric cap are located on laterally opposite sides of the middle portion of the self-aligned dielectric cap; and
a contact structure contacting at least one source/drain region of the functional gate structure, wherein the contact structure directly contacts a sidewall of the dielectric spacer and has a bottommost surface that is coplanar with a bottommost surface of the dielectric spacer, a bottommost surface of the gate dielectric material layer, a topmost surface of the at least one source/drain region, and a topmost surface of the semiconductor material substrate.

2. The semiconductor structure of claim 1, wherein the gate dielectric material layer is located on a sidewall of the gate conductor structure and a bottommost surface of the gate conductor structure, wherein the gate dielectric material layer has a vertical thickness along the sidewall of the gate conductor structure that is less than the vertical thickness of the middle portion of the gate conductor structure.

3. The semiconductor structure of claim 2, wherein each of the first and second end portions of the self-aligned dielectric cap extends onto a topmost surface of the gate dielectric material layer and a topmost surface of the dielectric spacer.

4. The semiconductor structure of claim 1, wherein the gate dielectric material layer has a vertical thickness that is the same as a vertical thickness of the dielectric spacer.

5. The semiconductor structure of claim 4, wherein the vertical thickness of the gate dielectric material layer and the vertical thickness of the dielectric spacer are the same as the vertical thickness of an outermost edge of the first end portion and the second end portion of the gate conductor structure.

6. The semiconductor structure of claim 1, wherein an upper portion of one of the first and second end portions of the self-aligned dielectric cap that is in direct physical contact with the contact structure has a chamfered surface.

7. The semiconductor structure of claim 6, wherein the contact structure has an upper portion of a first width and a lower portion of a second width that is less than the first width, wherein the upper and lower portions of the contact structure are separated by a middle portion having tapered sidewalls that are in direct contact with the chamfered surface of the self-aligned dielectric cap.

8. The semiconductor structure of claim 1, further comprising a first interlayer dielectric (ILD) material laterally surrounding the functional gate structure, and a second interlayer dielectric (ILD) material located on the first ILD material and on the self-aligned dielectric cap.

9. The semiconductor structure of claim 8, wherein the contact structure has a topmost surface that is coplanar with a topmost surface of the second ILD material.

10. The semiconductor structure of claim 1, wherein the semiconductor material substrate comprises a bulk semiconductor substrate, a topmost semiconductor material layer of a semiconductor-on-insulator, a semiconductor fin or a semiconductor nanowire.

* * * * *